(12) United States Patent
Andersson et al.

(10) Patent No.: US 9,123,837 B2
(45) Date of Patent: Sep. 1, 2015

(54) SEMICONDUCTOR DETECTOR WITH RADIATION SHIELD

(71) Applicant: Oxford Instruments Analytical Oy, Espoo (FI)

(72) Inventors: Hans Andersson, Vantaa (FI); Pasi Kostamo, Espoo (FI); Veikko Kämäräinen, Helsinki (FI); Seppo Nenonen, Espoo (FI)

(73) Assignee: Oxford Instruments Analytical Oy, Espoo (FI)

( * ) Notice: Subject to any disclaimer, the term of this patent is extended or adjusted under 35 U.S.C. 154(b) by 0 days.

(21) Appl. No.: 13/906,655

(22) Filed: May 31, 2013

(65) Prior Publication Data

US 2014/0353786 A1     Dec. 4, 2014

(51) Int. Cl.
| | |
|---|---|
| H01L 31/0216 | (2014.01) |
| H01L 31/08 | (2006.01) |
| H01L 23/552 | (2006.01) |
| G01T 1/24 | (2006.01) |
| H01L 31/115 | (2006.01) |
| H01L 31/0224 | (2006.01) |

(52) U.S. Cl.
CPC .......... *H01L 31/0216* (2013.01); *G01T 1/241* (2013.01); *H01L 23/552* (2013.01); *H01L 31/02164* (2013.01); *H01L 31/022416* (2013.01); *H01L 31/085* (2013.01); *H01L 31/115* (2013.01)

(58) Field of Classification Search
CPC .......... H01L 31/115; H01L 27/14676; H01L 27/144; H01L 23/552
USPC .................................................. 257/659, 428
See application file for complete search history.

(56) References Cited

U.S. PATENT DOCUMENTS

| | | | |
|---|---|---|---|
| 5,111,052 A | 5/1992 | Ontsuchi et al. | |
| 5,786,609 A | 7/1998 | Kemmer et al. | |
| 7,105,827 B2 | 9/2006 | Lechner et al. | |
| 2010/0163742 A1* | 7/2010 | Watanabe et al. | 250/370.15 |
| 2011/0240869 A1* | 10/2011 | Kim et al. | 250/370.09 |
| 2013/0009270 A1* | 1/2013 | Tsai et al. | 257/459 |
| 2014/0209809 A1 | 7/2014 | Zhang et al. | |

FOREIGN PATENT DOCUMENTS

| | | |
|---|---|---|
| WO | WO-2006053938 | 5/2006 |
| WO | WO-2012084186 | 6/2012 |

* cited by examiner

*Primary Examiner* — Yu-Hsi D Sun
(74) *Attorney, Agent, or Firm* — Harrington & Smith

(57) ABSTRACT

A semiconductor radiation detector includes a bulk layer of semiconductor material. On a first side of said bulk layer is an arrangement of field electrodes and a collection electrode for collecting radiation-induced signal charges from said bulk layer. A radiation shield exists on a second side of said bulk layer, opposite to said first side, which radiation shield selectively overlaps the location of said collection electrode.

19 Claims, 3 Drawing Sheets

SEMICONDUCTOR DETECTOR WITH RADIATION SHIELD

TECHNICAL FIELD

This invention is related to the general technical field of semiconductor radiation detectors. Especially the invention is related to the task of making semiconductor radiation detectors more accurate, more reliable, and more robust in operation.

BACKGROUND OF THE INVENTION

A drift detector is a semiconductor radiation detector in which a transversal electric field created inside a block of semiconductor material drives radiation-induced signal charges to a collection electrode. Widely known is the SDD or silicon drift detector, in which the semiconductor material is high-purity silicon with a very low leakage current, and the transversal electric field is created with concentric ring- or arc-like field electrodes on its surface. The collection electrode is an anode located close to the common center point of the electrode rings.

Two basic electrode layouts are known for SODS. The more traditional SDDs are ring-shaped, with the collection anode located at the center. More recently there have been introduced the so-called droplet-shaped SDDs that have a wide and a pointed end. The electrode rings spread out across the large end, while the collection anode is located relatively close to the narrow end.

An amplifier, which typically comprises a field-effect transistor (FET), is frequently combined with an SDD either by building it directly into the same piece of semiconductor material or by combining it with the SDD chip, for example by bump bonding to contact pads on its surface. The electrode rings in the SDD are of the $p^+$ semiconductivity type and they are made by ion implantation. An electric insulator layer, typically made of silicon dioxide, covers that side of the SDD chip that carries the electrode rings, the collection anode, and the amplifier (if any).

Although the task of a radiation detector is to absorb radiation, it suffers from adverse effects of absorbed ionizing radiation over time like all semiconductor devices. As an example of radiation-induced ageing, the surface-generated current at the $SiO_2$—Si interface in between the ion-implanted $p^+$ rings is increased by radiation. Also other kind of radiation-induced ageing, which does not appear to be related to said surface current, develops over time, weakening the measurement accuracy and eventually leading to the need to replace the whole detector.

SUMMARY OF THE INVENTION

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with a first aspect of the invention, there is provided a semiconductor radiation detector, which comprises:

a bulk layer of semiconductor material, on a first side of said bulk layer, an arrangement of field electrodes and a collection electrode for collecting radiation-induced signal charges from said bulk layer, and a radiation shield on a second side of said bulk layer, opposite to said first side, which radiation shield selectively overlaps the location of said collection electrode.

According to an objective of the present invention, adverse effects due to aging are avoided or at least significantly reduced by preventing or reducing the dielectric loss from increasing due to radiation-induced defects in the vicinity of the anode region. Most advantageously also the radiation-induced increase in the 1/f noise that naturally occurs in the amplifier component is prevented or reduced.

These and further objectives and advantages of the invention are achieved by shielding at least the anode region (or more generally: the collecting electrode region) against incoming radiation. Most advantageously the same radiation shield protects also the amplifier, if it is located adjacent to the anode region.

The shield may comprise a layer of relatively heavy material located so that it interrupts the propagation of incoming radiation to the region of the anode and the amplifier.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF EMBODIMENTS OF THE INVENTION

Figure 1:
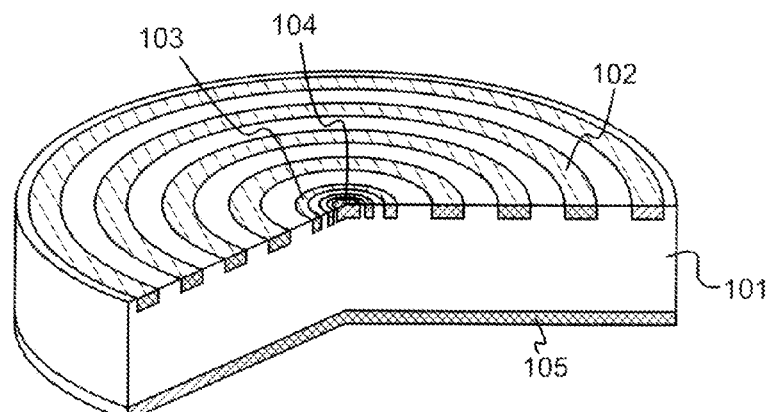
FIG. 1 illustrates a silicon drift detector.

FIG. 1 is the familiar partial cutaway diagram that illustrates the general structure of an SDD, which here serves as an example of a semiconductor radiation detector. It comprises a bulk layer 101 of semiconductor material. On a first side of the bulk layer, which here is the upper side, the semiconductor radiation detector comprises an arrangement of concentric field electrodes 102 and a centrally located collection electrode 103. The bulk layer 101 may be of high-purity silicon of the $n^-$ semiconductivity type, in which case the field electrodes 102 may be ion implantations of the $p^+$ semiconductivity type. Signal charges in the $n^-$ semiconductivity type bulk layer 101 are electrons and the task of the collection electrode 103 is to collect radiation-induced signal charges, for which reason the collection electrode 103 may be referred to as the anode. It may be for example an annular ion-implanted semiconductor region of the $n^+$ semiconductivity type.

The semiconductor radiation detector comprises also an amplifier adjacent to the anode. In the case of FIG. 1 the amplifier comprises a field-effect transistor built directly into the same chip. Reference designator 104 refers in general to the ion-implanted regions that constitute the source, drain, and gate of the field-effect transistor. A back side contact layer 105, which may be for example an ion implanted layer of the $p^+$ semiconductivity type or a metallic layer on the back surface of the bulk layer, covers the opposite side of the bulk layer.

Figure 2:
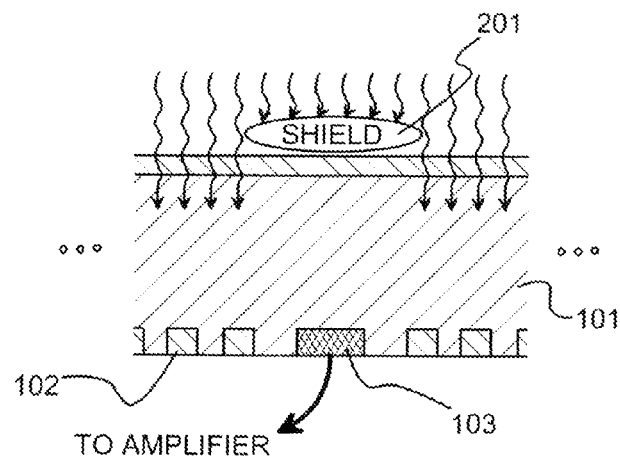
FIG. 2 illustrates a principle of a radiation shield in a semiconductor radiation detector.

FIG. 2 illustrates schematically a principle of using a radiation shield 201 to protect the immediate vicinity of the collection electrode 103 from radiation-induced damage. In the investigation that lead from the present invention it was found that prolonged exposure to incoming radiation causes dielectric loss to increase in the semiconductor material that is located in the vicinity of the collection electrode; particularly between the anode and the innermost field electrode. The principle that is schematically illustrated in FIG. 2 involves placing a radiation shield 201 on the other side of the bulk layer 101, i.e. on that side that is opposite to the side where the anode is located. This is the side from which the radiation comes; we are thus considering a so-called back-illuminated radiation detector.

Saying that the radiation shield is on the other side of the bulk layer does not take any position concerning what is the exact relation of the radiation shield to the very surface of the bulk layer. Various alternative embodiments of placing the radiation shield in relation to the surface of the bulk layer will be considered in more detail later.

The radiation shield 201 selectively overlaps the location of the collection electrode 103. Overlapping means that if one projects the outline of the radiation shield in the principal propagation direction of the incoming radiation to that side of the bulk layer where the collection electrode is located, the projected outline enclosed a majority of the region where the increasing dielectric loss could be observed. This is the region of the collection electrode, as well as the zone of dielectric material that separates the collection electrode from the nearest field electrode. The overlapping being selective means that the radiation shield allows the incoming radiation to reach other parts of the bulk layer to as large extent as possible: the radiation shield is so designed that it shadows the collection electrode region and its immediate surroundings but not much more. For example in the case of concentric-ring-shaped field electrodes the shielding effect does not extend further out than the innermost field electrode ring.

Figure 3:
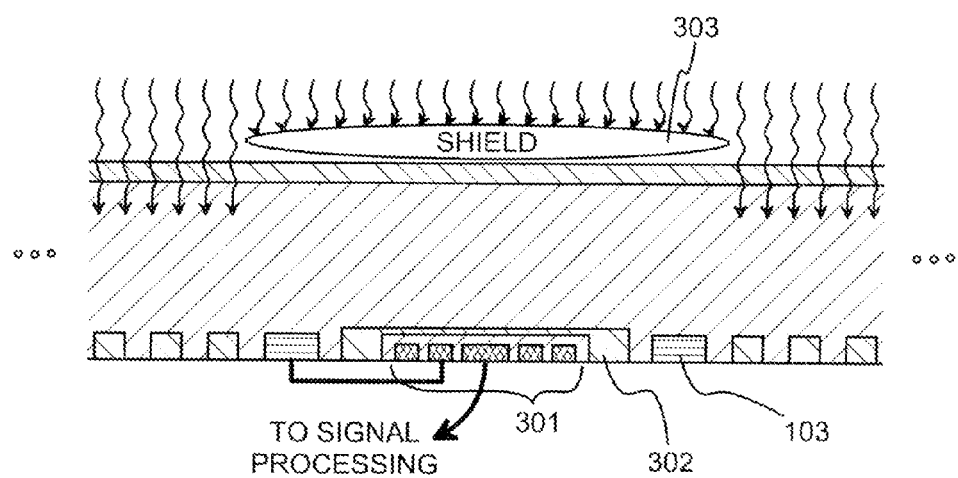
FIG. 3 illustrates the principle of a radiation shield in another semiconductor radiation detector.

The semiconductor radiation detector may comprise an amplifier, which may comprise a field effect transistor, adjacent to the collection electrode. In such case it is advantageous to make the radiation shield also overlap the location of essential parts of the amplifier. A part of the amplifier is essential in this respect if it is prone to radiation-induced damage at energies of incoming radiation that the detector is meant to measure. For example in the structure illustrated in FIG. 3 the collection electrode 103 is a ring-shaped anode, inside of which is an integrally built FET that comprises source, gate, and drain regions collectively referred to as 301. The collection electrode 103 is conductively coupled to one of them, for example the gate region. A basin region 302 separates the FET from the rest of the semiconductor material. The shield 303, which is only schematically shown in FIG. 3, is large enough so that it overlaps both the location of the collection electrode and the location of the amplifier component.

Figure 4:
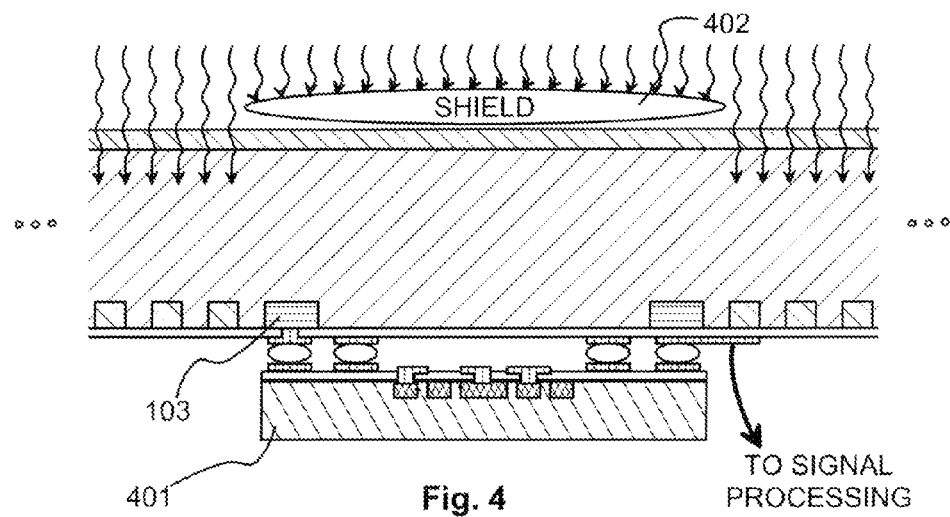
FIG. 4 illustrates the principle of a radiation shield in another semiconductor radiation detector.

FIG. 4 is yet another schematic illustration in which the amplifier, which is located adjacent to the collection electrode 103, comprises a FET built into a separate chip 401 that is mechanically and electrically connected to the main detector chip by bump bonding. As such, the separate chip 401 may be much larger than just the implanted regions that constitute the FET, but since the FET regions are particularly prone to increasing 1/f noise due to radiation exposure, it is sufficient for the shield 402 (which is again shown only schematically) to overlap the location of the actual amplifier.

All considerations above concerning the advantageous size of the radiation shield and its overlap with the location(s) of the collection electrode and possibly the amplifier are applicable to the following examples of how the radiation shield is actually implemented.

Figure 5:
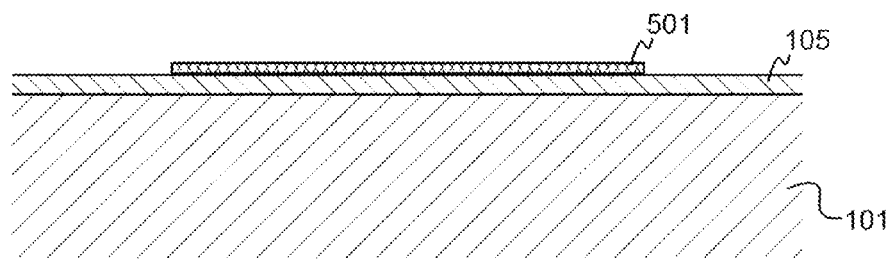
FIGS. 5 to 8 illustrate various structural solutions of layer-like radiation shields.

FIG. 5 is a schematic cross section of a semiconductor radiation detector comprising a radiation shield according to an embodiment of the invention. The bulk layer 101 and the back side contact layer 105 are shown, but the electrode structures on the front side of the bulk layer are omitted for reasons of graphical clarity. The radiation shield 501 is a material layer that is directly attached to the surface of the same piece of material that also comprises the bulk layer 101. In particular, in FIG. 5 said "piece of material" is the detector chip, in which a back side contact layer 105 has been formed on one surface of the bulk layer 101. The radiation shield 501 may be formed as a coated layer on the surface of the back side contact layer 105 with a thin film deposition technique, or it may be a piece of material glued to or otherwise attached to the back side contact layer. For example an adhesive may be used to attach a piece of previously manufactured foil in place, or the foil may be e.g. soldered in place.

Figure 6:
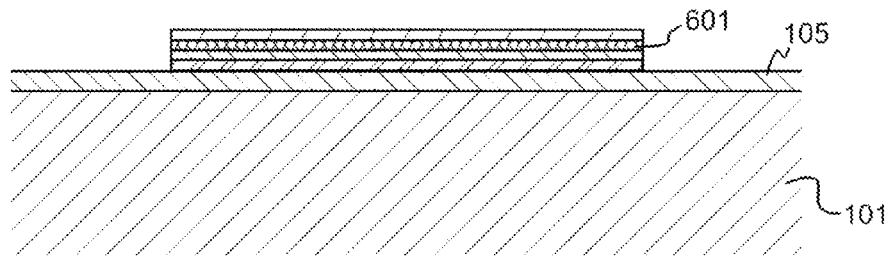

In the embodiment of FIG. 6 the back side contact layer 105 is again located on the back side surface of the bulk layer 101. The radiation shield is a layer 601 in a stack of layers on the back side contact layer 105. The other layers in said stack may have various functions, including but not being limited to: enhancing attachment between layer materials; absorbing secondary radiation; shaping the absorption spectrum of the radiation shield.

Figure 7:
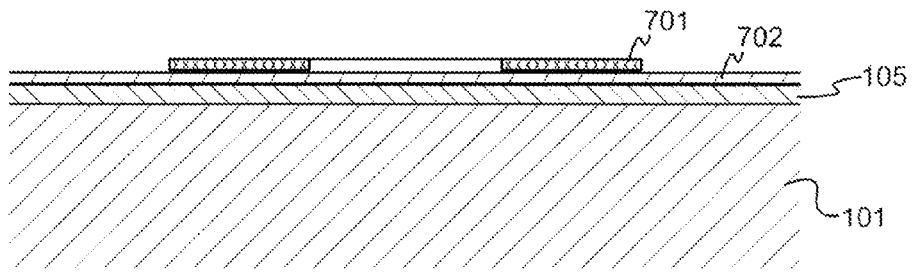

FIG. 7 illustrates some important generalizations to the concepts discussed so far. First, the radiation shield 701 does not need to be continuous but it may comprise openings. In this case we assume that the collection electrode (not shown) is annular in form, but there is no significant part of an amplifier inside it or the radiation shield does not need to shield the amplifier. Consequently the radiation shield 701 may have an annular form. Second, if there are other layers than the radiation shield on the back side of the detector chip, not all layers need to have the same transversal dimensions. In this example an electric insulation layer 702 covers essentially the whole back side contact layer 105, and is thus significantly larger in transversal dimensions than the radiation shield 701.

Figure 8:
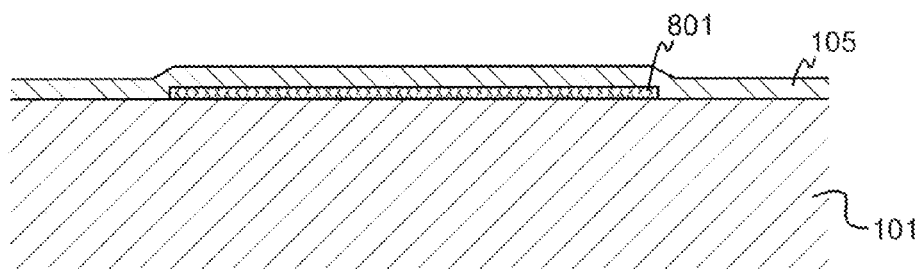

FIG. 8 illustrates another alternative embodiment, in which the radiation shield 801 is located between the bulk layer 101 and the back side contact layer 105. In the manufacturing process this means that the radiation shield is first formed on the back surface of the bulk layer, preferably with a thin film deposition technique, and the back side contact layer is formed only thereafter.

Figure 9:
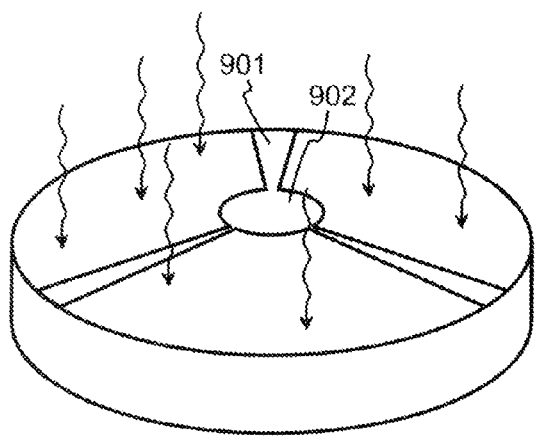
FIGS. 9 and 10 illustrate various structural solutions of separately supported radiation shields.
Figure 10:
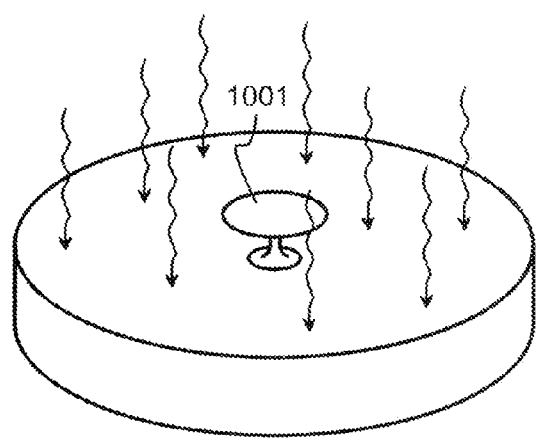

The radiation shield does not need to be in direct contact with the back side of the detector chip. FIGS. 9 and 10 illustrate some structural alternatives in which the radiation shield is a separate piece of material supported on the second side of the bulk layer and separated therefrom by an empty space. The embodiment of FIG. 9 comprises three support spokes 901 that extend radially outwards from the radiation shield 902 in the middle. The distant ends of the support spokes are attached to the edges of the detector chip, or to other surrounding structures so that the radiation shield 902 is held in place at a location where it selectively overlaps the location of at least the collection electrode (not shown in FIG. 9). Depending on factors like material rigidity, required minimization in shadowing, and required structural stability, there may be one or more such support spokes. In the embodiment of FIG. 10 the same effect is achieved with a vertical support that attaches the radiation shield 1001 to a spot directly below it on the surface of the semiconductor chip.

The material(s) and thickness of the radiation shield should be selected according to a set of criteria. First, the radiation shield should effectively attenuate incoming radiation in energy ranges that will most commonly be encountered during the use of the semiconductor radiation detector. Second, the radiation shield should not give rise to significant amounts of secondary radiation that could interfere with the detection of the actual incoming radiation. Third, the material of the radiation shield should be compatible with the processes that are used to manufacture the detector chip and to complete the radiation detector assembly. For the attenuation of radiation to be effective, it is preferable that the radiation shield comprises a material that is heavier (i.e. that has a larger atomic number) than aluminium. Advantageous materials for the radiation shield include, but are not limited to, relatively heavy metals such as gold, platinum, palladium, zirconium, molybdenum, silver, indium, tin, tantalum, tungsten, iridium, and bismuth.

The embodiments described so far assumed that the bulk layer is shaped as a circular disk, and that the field electrodes constitute a set of concentric rings, so that each field electrode of a particular size encircles all other field electrodes that are smaller in size. Also it was assumed that the collection electrode is located at or adjacent to the common center point that is both the center point of the field electrodes and a center point of a side face of the bulk layer. In such a configuration the collection electrode region of prior art detectors has been most vulnerable to radiation-induced aging. In a practical detector the disk form of the detector chip is not necessarily circular: it may be for example rectangular, hexagonal, or octagonal; or it may have some other shape. Also the field electrodes are not necessarily circular rings. Detectors are known in which the field electrodes are for example hexagonal or octagonal.

In a droplet-shaped detector, in which the detector chip has a large end and a pointed end and the collection electrode is located in the pointed end, the edge of the radiation window may cover the anode region anyway (although not selectively, because the edge of the radiation window covers also large other parts of the same structure), so there is no need for a separate radiation shield. However, it is possible that the anode region or its immediate vicinity extends so far towards the active area of the detector that some of the radiation-induced disadvantageous effects referred to above become actual.

Figure 11:
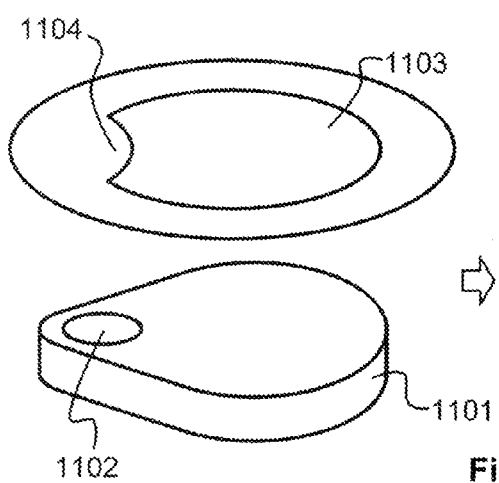
FIG. 11 illustrates a radiation shield in a droplet-formed detector.

FIG. 11 illustrates a way in which the principles explained above may be extrapolated to a droplet-shaped detector. The detector chip 1101 is droplet-shaped, and contains an collection electrode region 1102 at or close to its pointed end. In a completed detector assembly a radiation window 1103 will be placed over the detector chip 1101, which radiation window comprises a window foil of negligible attenuation supported in a frame of material that attenuates essentially all radiation. Following the principles described above, the frame comprises an extension 1104 that is so formed that in the completed radiation detector assembly it selectively overlaps the collection electrode region 1102.

The invention claimed is:

1. A semiconductor radiation detector, comprising:
a bulk layer of semiconductor material,
on a first side of said bulk layer, an arrangement of field electrodes and a collection electrode for collecting radiation-induced signal charges from said bulk layer, and
a radiation shield on a second side of said bulk layer, opposite to said first side, which radiation shield selectively overlaps the location of said collection electrode such that an outline of a projection of the radiation shield in a direction perpendicular to the second side of the bulk layer encloses at least the location of the collection electrode.

2. A semiconductor radiation detector according to claim 1, comprising an amplifier adjacent to said collection electrode, wherein said projection of said radiation shield also overlaps the location of essential parts of the amplifier.

3. A semiconductor radiation detector according to claim 1, wherein said radiation shield is a material layer directly attached to a surface of the same piece of material that also comprises said bulk layer.

4. A semiconductor radiation detector according to claim 3, comprising a back side contact layer on the second side of said bulk layer, wherein said radiation shield is a coated layer on said back side contact layer.

5. A semiconductor radiation detector according to claim 1, comprising a back side contact layer on the second side of said bulk layer, wherein said radiation shield is a layer in a stack of layers on said back side contact layer.

6. A semiconductor radiation detector according to claim 1, comprising a back side contact layer on the second side of said bulk layer, wherein said radiation shield is a piece of material glued to or otherwise attached to said back side contact layer.

7. A semiconductor radiation detector according to claim 1, wherein said radiation shield is a separate piece of material supported on the second side of said bulk layer and separated therefrom by an empty space.

8. A semiconductor radiation detector according to claim 7, comprising one or more support spokes that extend outwards from the radiation shield.

9. A semiconductor radiation detector according to claim 1, wherein the radiation shield comprises a metal selected from: gold, platinum, palladium, zirconium, molybdenum, silver, indium, tin, tantalum, tungsten, iridium, and bismuth.

10. A semiconductor radiation detector according to claim 1, wherein the radiation shield comprises a number of layers of different materials, one of which is a metal selected from: gold, platinum, palladium, zirconium, molybdenum, silver, indium, tin, tantalum, tungsten, iridium, and bismuth.

11. A semiconductor radiation detector according to claim 1, wherein:
the bulk layer is shaped as a disc,
the field electrodes constitute a set of concentric rings, so that each field electrode of a particular size encircles all other field electrodes that are smaller in size, and the collection electrode is located at or adjacent to the common center point that is both the center point of the field electrodes and a center point of a side face of said bulk layer.

12. A semiconductor radiation detector according to claim 1, wherein the semiconductor radiation detector is a silicon drift detector.

13. A semiconductor radiation detector according to claim 12, comprising an amplifier adjacent to said collection electrode, wherein said projection of said radiation shield also overlaps the location of essential parts of the amplifier.

14. A semiconductor radiation detector according to claim 12, wherein said radiation shield is a material layer directly attached to a surface of the same piece of material that also comprises said bulk layer.

15. A semiconductor radiation detector according to claim 14, comprising a back side contact layer on the second side of said bulk layer, wherein said radiation shield is a coated layer on said back side contact layer.

16. A semiconductor radiation detector according to claim 12, comprising a back side contact layer on the second side of said bulk layer, wherein said radiation shield is a layer in a stack of layers on said back side contact layer.

17. A semiconductor radiation detector according to claim 12, comprising a back side contact layer on the second side of said bulk layer, wherein said radiation shield is a piece of material glued to or otherwise attached to said back side contact layer.

18. A semiconductor radiation detector according to claim 12, wherein said radiation shield is a separate piece of material supported on the second side of said bulk layer and separated therefrom by an empty space.

19. A semiconductor radiation detector according to claim wherein the radiation shield comprises material heavier than aluminum.

* * * * *